(12) United States Patent
Lee et al.

(10) Patent No.: US 9,374,035 B2
(45) Date of Patent: Jun. 21, 2016

(54) OSCILLATOR WITH DIFFERENTIAL STRUCTURE

(71) Applicant: SOONGSIL UNIVERSITY RESEARCH CONSORTIUM TECHNO-PARK, Seoul (KR)

(72) Inventors: Mi Lim Lee, Yangju-si (KR); Chang Kun Park, Gwangmyeong-si (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 14/571,227

(22) Filed: Dec. 15, 2014

(65) Prior Publication Data

US 2016/0065130 A1  Mar. 3, 2016

(30) Foreign Application Priority Data

Aug. 27, 2014  (KR) .................. 10-2014-0112406

(51) Int. Cl.
| | |
|---|---|
| *H03B 5/12* | (2006.01) |
| *H03B 5/08* | (2006.01) |
| *H01L 29/66* | (2006.01) |
| *H01L 27/08* | (2006.01) |

(52) U.S. Cl.
CPC .................. *H03B 5/1212* (2013.01)

(58) Field of Classification Search
CPC .. H03B 5/1212; H03B 5/1228; H03B 5/1231; H01L 29/41725; H01L 23/528
USPC ............ 257/40; 331/177 V, 36 C, 117 F, 167, 331/108 R
See application file for complete search history.

(56) References Cited

U.S. PATENT DOCUMENTS

| | | | | | |
|---|---|---|---|---|---|
| 4,297,654 | A | * | 10/1981 | Goerth | H01L 21/761 257/E21.544 |
| 4,947,140 | A | * | 8/1990 | Tateishi | H03K 3/354 331/113 R |
| 5,600,280 | A | * | 2/1997 | Zhang | H03B 5/24 327/180 |
| 6,002,303 | A | * | 12/1999 | Carralero | H03B 5/1231 331/108 D |
| 6,249,190 | B1 | * | 6/2001 | Rozenblit | H03B 5/1231 331/117 R |
| 7,545,230 | B2 | * | 6/2009 | Jang | H03B 5/1228 331/117 FE |
| 8,044,733 | B1 | * | 10/2011 | Arora | H03B 5/1243 331/117 FE |
| 8,212,625 | B2 | * | 7/2012 | Lee | H03B 5/1228 331/117 FE |
| 8,766,735 | B2 | * | 7/2014 | Sun | H03B 5/1212 331/115 |
| 2004/0130404 | A1 | * | 7/2004 | Ruffieux | H03B 5/326 331/154 |
| 2004/0183606 | A1 | * | 9/2004 | Komurasaki | H03B 5/1847 331/117 R |
| 2013/0044838 | A1 | * | 2/2013 | Ding | H03B 5/1228 375/340 |

FOREIGN PATENT DOCUMENTS

WO   WO 2010/148257 A1   12/2010

* cited by examiner

*Primary Examiner* — Vongsavanh Sengdara
*Assistant Examiner* — Thai T Vuong
(74) *Attorney, Agent, or Firm* — Revolution IP, PLLC

(57) ABSTRACT

An oscillator with a differential structure which is formed in an integrated circuit, including: a first transistor and a second transistor in each of which a drain electrode, a gate electrode, and a source electrode are sequentially arranged, a drain of the first transistor is connected with a gate of the second transistor through a first wiring, a drain of the second transistor is connected with a gate of the first transistor through a second wiring, and a first end of a source of the first transistor and a first end of a source of the second transistor are connected through a third wiring, and a second end of the source of the first transistor and a second end of the source of the second transistor are connected through a fourth wiring.

12 Claims, 8 Drawing Sheets

OSCILLATOR WITH DIFFERENTIAL STRUCTURE

CROSS-REFERENCE TO RELATED APPLICATIONS

This application claims the priority of Korean Patent Application No. 10-2014-0112406 filed on Aug. 27, 2014, in the Korean Intellectual Property Office, the disclosure of which is incorporated herein by reference.

BACKGROUND OF THE INVENTION

1. Field of the Invention

The present invention relates to an oscillator with a differential structure, and more particularly, to an oscillator with a differential structure having a wiring of a transistor to maintain symmetry of a differential signal.

2. Description of the Related Art

An oscillator is a device allows for output of a desired frequency, using a voltage applied from the outside. An oscillator using a transistor is generally used, and there are an LC oscillator, an RC oscillator, and an oscillator using a wien-bridge, which are all sinusoidal oscillators.

An oscillator, an active component for amplifying, includes a transistor and a negative resistor, and in connection with such an oscillator, a voltage-controlled oscillator including transistors cross over each other has been proposed in the related art.

FIG. 1 is a diagram illustrating a common oscillator.

'MN1' and 'MN2' indicate transistors. As illustrated in FIG. 1, transistors M1 and M2 are arranged in a differential structure and the differential structure generates negative resistor. Further, an inductor and a capacitor in an oscillator are the most essential parts for generation of an oscillation frequency in the entire oscillator. It can be seen in FIG. 1 that a wire connecting a drain electrode of the transistor MN1 and a gate electrode of the transistor MN2 and a wire connecting a gate electrode of the transistor MN1 and a drain electrode of the transistor MN2 cross over each other.

The crossing-over structure illustrated in FIG. 1 is one of the most popular structures for oscillators formed in an integrated circuit. The output of the oscillator illustrated in FIG. 1 is generated as differential signals from the drains of the transistors MN1 and MN2. The frequency of the oscillator can be changed by changing the value of the inductor or the capacitor illustrated in FIG. 1 and the frequency of a VCO (Voltage-Controlled Oscillator) is changed by controlling a voltage.

The transistors MN1 and MN2 in the oscillator illustrated in FIG. 1 are differentially operated. Accordingly, when there is a phase difference of exactly 180 degrees between the voltages or currents at the gate, the drain, and the source of the transistor MN1 and the voltages or currents at the gate, the drain, and the source of the transistor MN2, the oscillator ideally operates.

When a phase difference of exact 180 degrees is not achieved in spite of differential operation inside the oscillator of FIG. 1, the performance of the oscillator decreases, such as reduction of output and an increase of a harmonic frequency. In order to prevent this problem, it is a very important factor to ensure symmetry of nodes where differential signals are generated, in arrangement of transistors and wirings according to the circuit diagram of FIG. 1.

FIGS. 2A to 2C are diagrams illustrating symbols and arrangement of a MOSFET transistor.

FIG. 2A illustrates symbols of the MOSFET transistor. FIG. 2B conceptually illustrates arrangement of the MOSFET transistor illustrated in FIG. 2A, corresponding to the symbols. As in the arrangement of the transistor illustrated in FIG. 2B, electrodes of the transistor are composed of a drain, a gate, and a source, and exactly, there is a need for forming a body-contact for forming body-bias of the transistor, as in FIG. 2B. However, the body-contact will be briefly described with reference to FIG. 2C, under the assumption that it was formed, for the convenience of description.

FIG. 3 is a diagram illustrating wirings for transistors according to the related art, using the arrangement of a transistor illustrated in FIG. 2.

As illustrated in FIG. 3, a first wiring between a gate electrode of a transistor MN1 and a drain electrode of a transistor MN2 and a second wiring between a drain electrode of the transistor MN1 and a gate electrode of the transistor MN2 cross over each other. According to the typical arrangement in the related art, when the gates and the drains of the transistors MN1 and MN2 are connected, there is a region with a crossover. The crossing wires are integrated in different metal layers in an integrated circuit to prevent a short circuit at the crossover.

According to the arrangement of transistors for an oscillator of the related art illustrated in FIG. 3, there is no problem with normal operation of the circuit, but the parasitic components of the highest metal layer and the lower metal layer under the highest metal layer are different. That is, the highest metal layer is far from the substrate of the integrated circuit, so a loss due to the substrate is relatively small, while the lower metal layer is close to the substrate, so a loss due to the substrate is relatively large. Accordingly, in this configuration, impedances produced by the parasitic components at the gates or the drains of the transistors MN1 and MN2 are not symmetric to each other, so the power generated by the transistors is different, and the voltages or the currents are also different. Further, the phases of differential signals generated at two nodes fail to make exactly 180 degrees, such that a harmonic component is generated at an output node.

In order to solve this problem, it may be possible to consider the following wiring type modified from the type described above. That is, a method, which makes a metal wire connecting a gate of a transistor MN1 and a drain of a transistor MN2, using the highest metal layer of a corresponding integrated circuit, makes a metal wire connecting a gate of the transistor MN2 and a drain of the transistor MN1, basically using the highest metal layer, and partially uses a layer under the highest layer for the region with a crossover, may be considered. In this configuration, there is a section where it is required to connect the highest metal layer and the lower layer in order to connect the gate of the transistor MN2 and the drain of the transistor MN1, and in this case, a layer called Hole-Via is generally used.

However, the Hole-Via causes an additional parasitic impedance component. In this configuration, as compared with the wiring between the gate of the transistor MN1 and the drain of the transistor MN2, the metal layer under the highest metal layer is partially used for the wiring between the gate of the transistor MN2 and the drain of the transistor MN1 and the Hole-Via is additionally used, such that there is still the problem of asymmetry between differential signal lines.

The background art of the present invention has been described in Korean Patent Publication No. 2012-0028391 (2012.03.22).

SUMMARY OF THE INVENTION

An aspect of the present invention provides an oscillator with a differential structure including transistors arranged to maintain symmetry between differential signals.

According to an aspect of the present invention, there is provided an oscillator with a differential structure which is formed in an integrated circuit. The oscillator includes: a first transistor and a second transistor in each of which a drain electrode, a gate electrode, and a source electrode are sequentially arranged, in which the first transistor and the second transistor are arranged such that the drain electrode of the first transistor and the drain electrode of the second transistor face each other or the source electrode of the first transistor and the source electrode of the second transistor face each other, a drain of the first transistor is connected with a gate of the second transistor through a first wiring, a drain of the second transistor is connected with a gate of the first transistor through a second wiring, and a first end of a source of the first transistor and a first end of a source of the second transistor are connected through a third wiring, and a second end of the source of the first transistor and a second end of the source of the second transistor are connected through a fourth wiring.

The third wiring and the fourth wiring may be connected to a ground power supply.

The first wiring and the third wiring may cross over each other not in contact with each other, and the second wiring and the fourth wiring may cross over each other not in contact with each other.

The first wiring and the second wiring may be made of the same material or the same element.

The drain of the first transistor and the drain of the second transistor may be connected to an input power supply.

The first transistor and the second transistor may be formed in multi-finger types including two or more of the drain electrodes or the source electrodes.

According to another aspect of the present invention, there is provided an oscillator with a differential structure which includes: a first transistor and a second transistor in each of which a drain electrode, a gate electrode, and a source electrode are sequentially arranged, in which the first transistor and the second transistor are arranged such that the drain electrode of the first transistor and the source electrode of the second transistor face each other or the source electrode of the first transistor and the drain electrode of the second transistor face each other, a drain of the first transistor is connected with a gate of the second transistor through a first wiring, a drain of the second transistor is connected with a gate of the first transistor through a second wiring, and a first end of a source of the first transistor and a first end of a source of the second transistor are connected through a third wiring, and a second end of the source of the first transistor and a second end of the source of the second transistor are connected through a fourth wiring.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
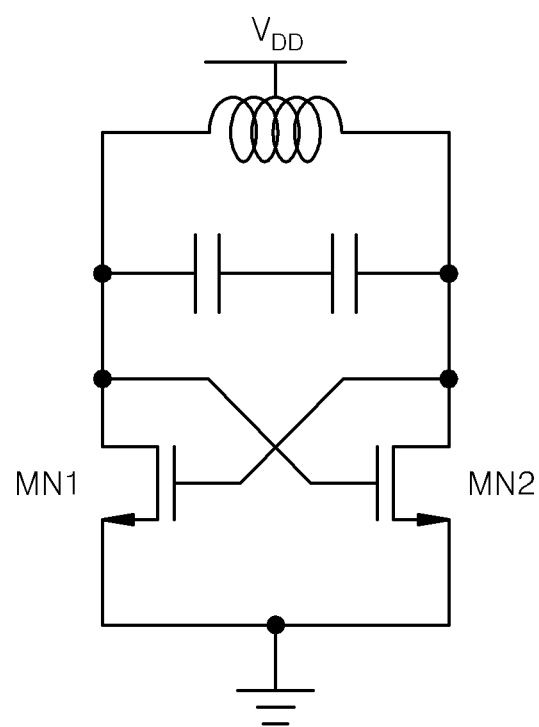
FIG. 1 is a diagram illustrating a common oscillator.
Figure 2A:
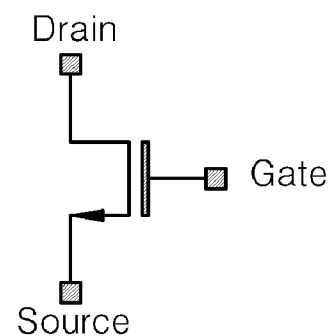
FIGS. 2A to 2C are diagrams illustrating symbols and arrangement of a MOSFET transistor.
Figure 2B:
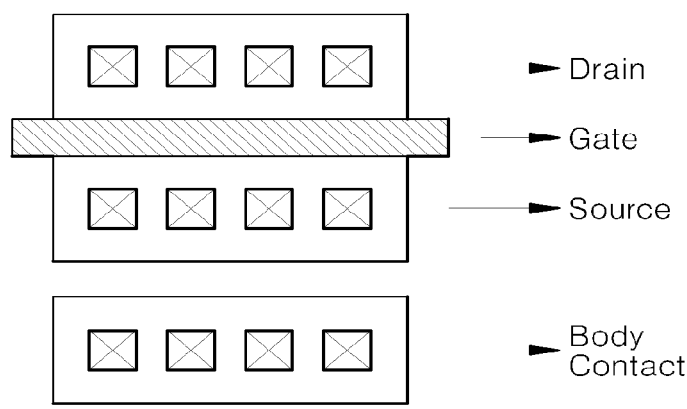
Figure 2C:
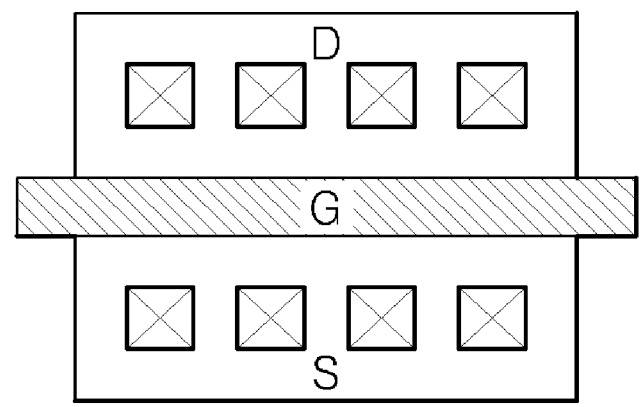
Figure 3:
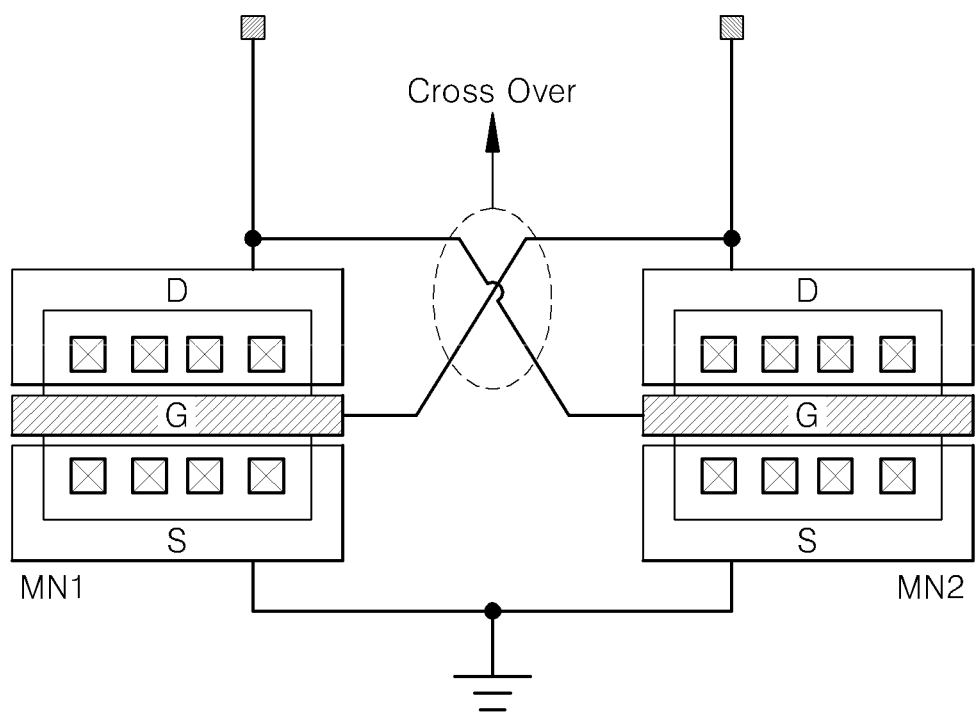
FIG. 3 is a diagram illustrating wirings for transistors according to the related art, using a MOSFET transistor illustrated in FIG. 2B.

Exemplary embodiments of the present invention will now be described in detail with reference to the accompanying drawings.

Embodiments of the present invention will be described in detail with reference to the accompanying drawings for those skilled in the art to easily achieve the present invention. However, the present invention may be achieved in various different ways and is not limited to the embodiments described herein. In the accompanying drawings, portions not related to the description will be omitted in order to obviously describe the present invention, and similar reference numerals will be used to describe similar portions throughout the present specification.

Throughout this specification, a case in which any one part is connected with the other part includes a case in which the parts are directly connected with each other and a case in which the parts are indirectly connected with each other with other elements interposed therebetween. In addition, unless explicitly described otherwise, "comprising" any components will be understood to imply the inclusion of other components but not the exclusion of any other components, and specify the presence of stated features, integers, steps, operations, elements, or components, but do not preclude the presence or addition of one or more other features, integers, steps, operations, elements, components, or groups thereof.

Hereinafter, various embodiments of the present invention will be described in detail with reference to FIGS. 4A to 6.

Figure 4A:
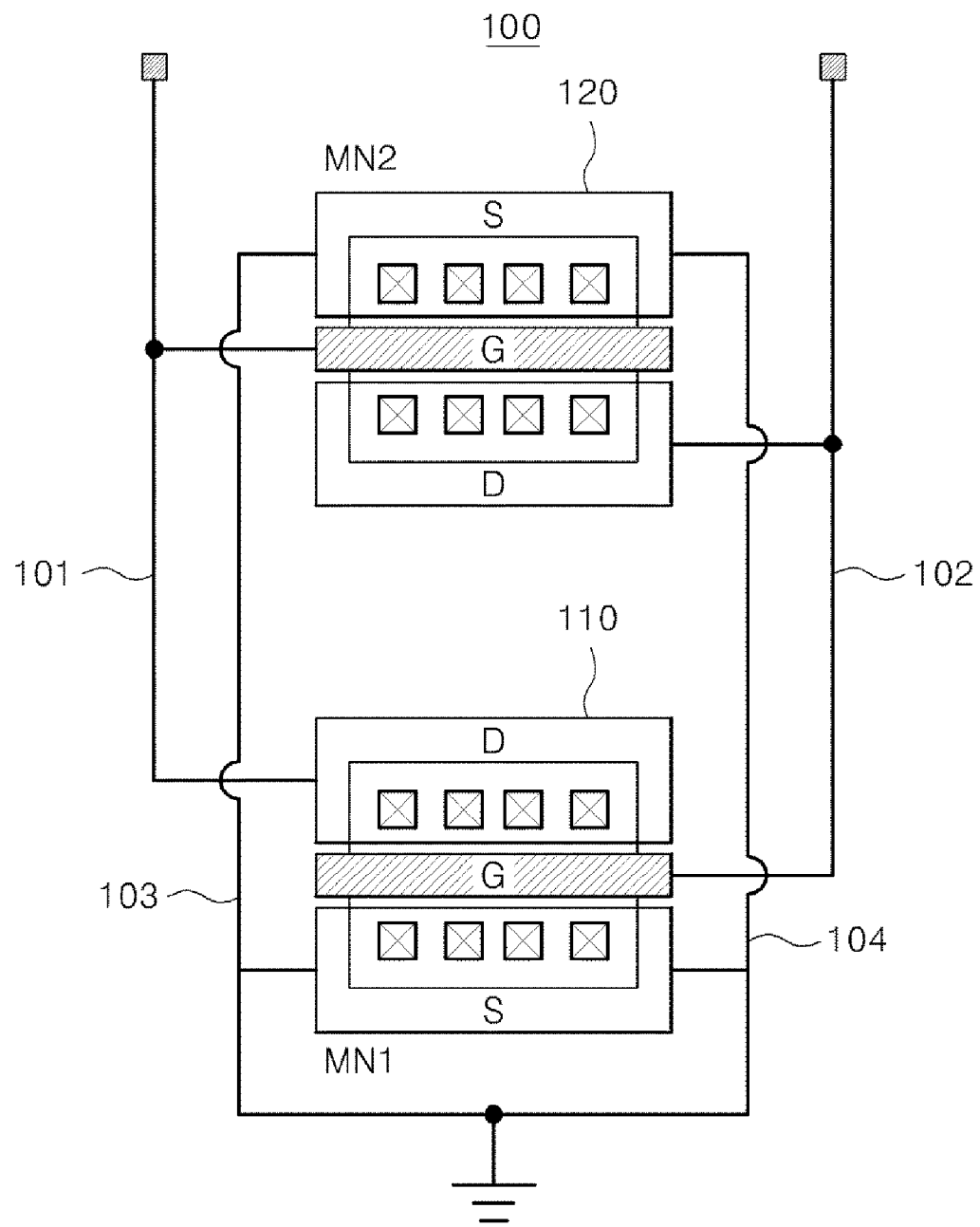
FIGS. 4A and 4B are diagram illustrating the configuration of an oscillator with a differential structure according to a first embodiment of the present invention.
Figure 4B:
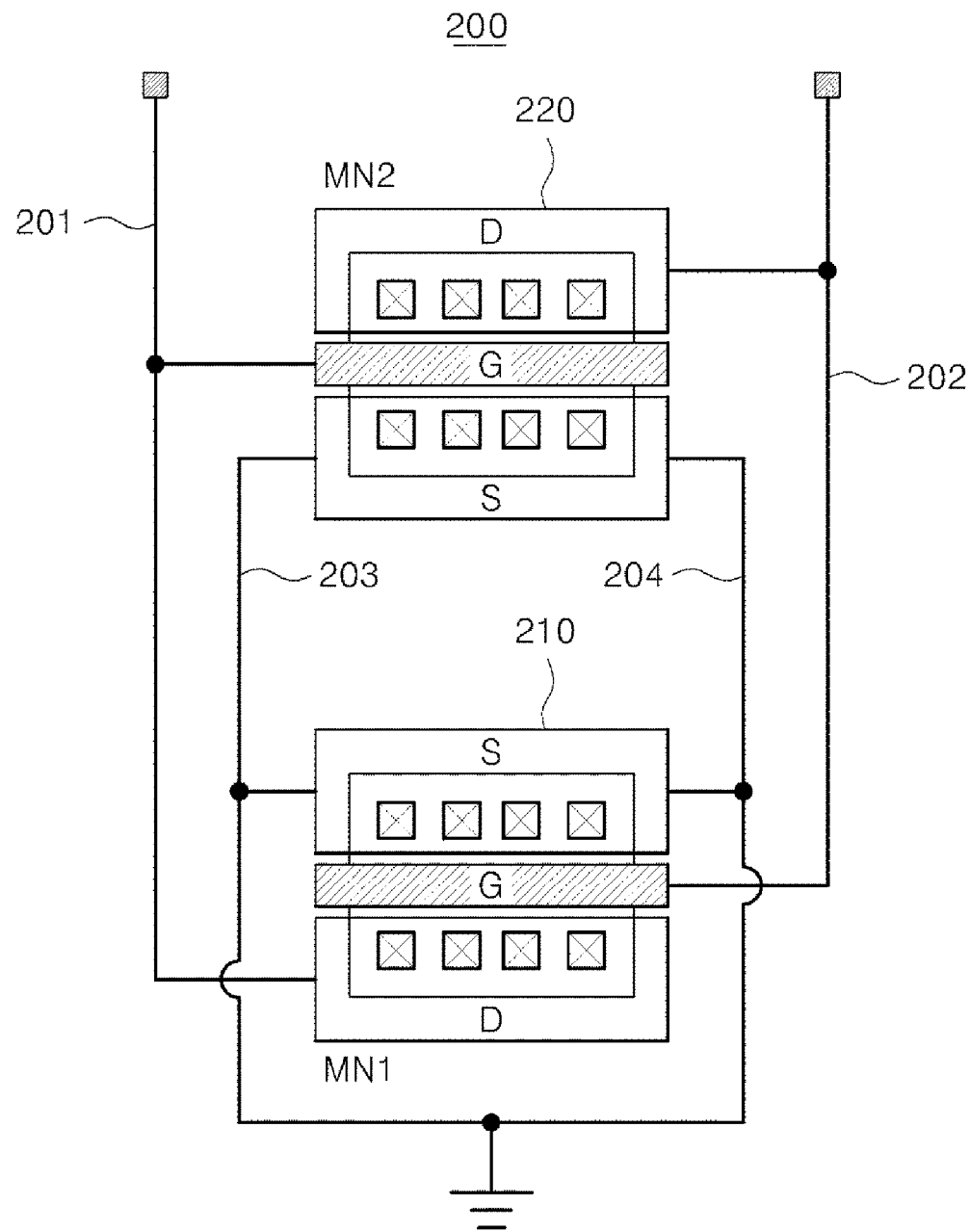

FIGS. 4A and 4B are diagram illustrating the configuration of an oscillator with a differential structure according to a first embodiment of the present invention.

As illustrated in FIGS. 4A and 4B, oscillators 100 and 200 with a differential structure according to the present invention includes, respectively, first transistors 110 and 210 and second transistors 120 and 220 in each of which a drain electrode, a gate electrode, and a source electrode are sequentially arranged.

In FIGS. 4A and 4B illustrating the first embodiment of the present invention, the configuration of transistors included in the oscillators are briefly illustrated and other components are not illustrated. Accordingly, similar to FIG. 1, referring to FIGS. 4A and 4B, the drain electrodes, which are indicated by 'MN1', of the first transistors 110 and 210 and the drain electrodes, which are indicated by 'MN2', of the second transistors 120 and 220 are connected to both ends of an input power supply $V_{DD}$, respectively, and an inductor or a capacitor may be connected in parallel to the input power supply $V_{DD}$. Further, the source electrodes of the first transistors 110 and 210 and the source electrodes of the second transistors 120 and 220 are connected to a ground power supply. Further, the gate electrodes and the drain electrode may be connected through an inductor, a capacitor, or a transformer in the first embodiment.

According to the first embodiment of the present invention, the first transistor and the second transistor may be arranged such that the drain electrode D of the first transistor 110 and the drain electrode D of the second transistor 120 face each other, as illustrated in FIG. 4A, or the source electrode S of the first transistor 210 and the source electrode S of the second transistor 220 face each other, as illustrated in FIG. 4B.

First, as illustrated in FIG. 4A, the drain electrode of the first transistor 110 and the drain electrode of the second transistor 120 may be arranged to face each other. That is, in an integrated circuit, the first transistor 110 is arranged and the second transistor 120 is arranged longitudinally such that the drain electrode of the first transistor 110 and the drain electrode of the second transistor 120 face each other.

Further, the drain of the first transistor 110 is connected with the gate electrode G of the second transistor 120 through a first wiring 101. As illustrated in FIG. 4A, the first wiring 101 is connected to the left sides, which are first ends, of the first transistor 110 and the second transistor 120 that are longitudinally arranged.

Further, the drain electrode of the second transistor 120 is connected with the gate electrode of the first transistor 110 through a second wiring 102. As illustrated in FIG. 4A, the second wiring 102 is connected to the right sides, which are second ends, of the first transistor 110 and the second transistor 120 that are longitudinally arranged.

The first wiring 101 and the second wiring 102 may be made of the same material or the same element in an integrated circuit so that parasitic impedance components make left-right symmetry.

Further, a first end of the source of the first transistor 110 and a first end of the source of the second transistor 120 are connected through a third wiring 103. As illustrated in FIG. 4A, the third wiring 103 is formed at left sides, which are the first ends, of the first transistor 110 and the second transistor 120 that are longitudinally arranged. The third wiring 103 is connected with a ground power supply.

In this configuration, a crossover of the first wiring 101 and the third wiring 103 is formed. The term 'crossover' is a point that is made by an upper metal layer or a lower metal layer in an integrated circuit and where wires cross each other not in contact with each other.

As illustrated in FIG. 4A, two crossovers may be formed at each of the left side and the right side of the first transistor 110 and the second transistor 120.

Further, a second end of the source of the first transistor 110 and a second end of the source of the second transistor 120 are connected through a fourth wiring 104. As illustrated in FIG. 4A, the fourth wiring 104 is formed at the right sides, which are the second ends, of the first transistor 110 and the second transistor 120 that are longitudinally arranged. The fourth wiring 104 may be connected with the ground power supply.

In this configuration, a crossover of the second wiring 102 and the fourth wiring 104 is formed at the right. The term 'crossover' means a point that is made by an upper metal layer or a lower metal layer in an integrated circuit and where wires cross each other not in contact with each other.

In the first embodiment of the present invention illustrated in FIG. 4B, a first wiring 201 to a fourth wiring 204 are formed in the same way as in FIG. 4A, so they are not repeatedly described. However, one crossover is formed at the left side and the right side of a first transistor 210 and a second transistor 220 due to crossing of the first wiring 201 and the third wiring 203 and crossing of a second wiring 202 and a fourth wiring 204. The crossovers may be differently formed in accordance with the position of the ground power supply.

As illustrated in FIGS. 4A and 4B, in the first embodiment, the same numbers of crossovers are formed at the left sides and the right sides of the first transistors 110 and 210 and the second transistors 120 and 220. That is, in the first embodiment, the same crossovers are formed symmetrically at the left sides and the right sides of the first transistors 110 and 210 and the second transistors 120 and 220.

An oscillator with a differential structure according to a second embodiment of the present invention is described hereafter.

Figure 5A:
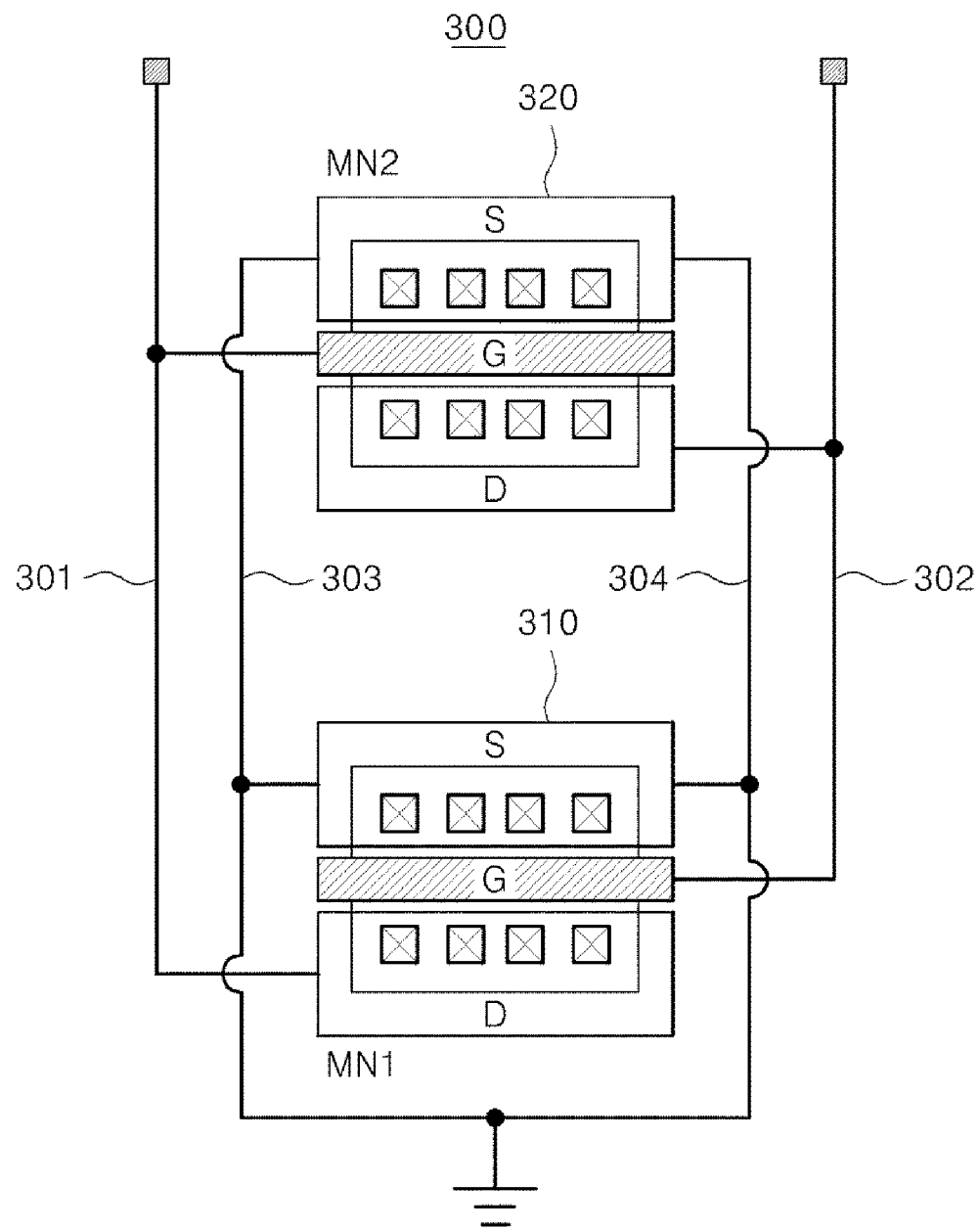
FIGS. 5A and 5B are diagram illustrating the configuration of an oscillator with a differential structure according to a second embodiment of the present invention.
Figure 5B:
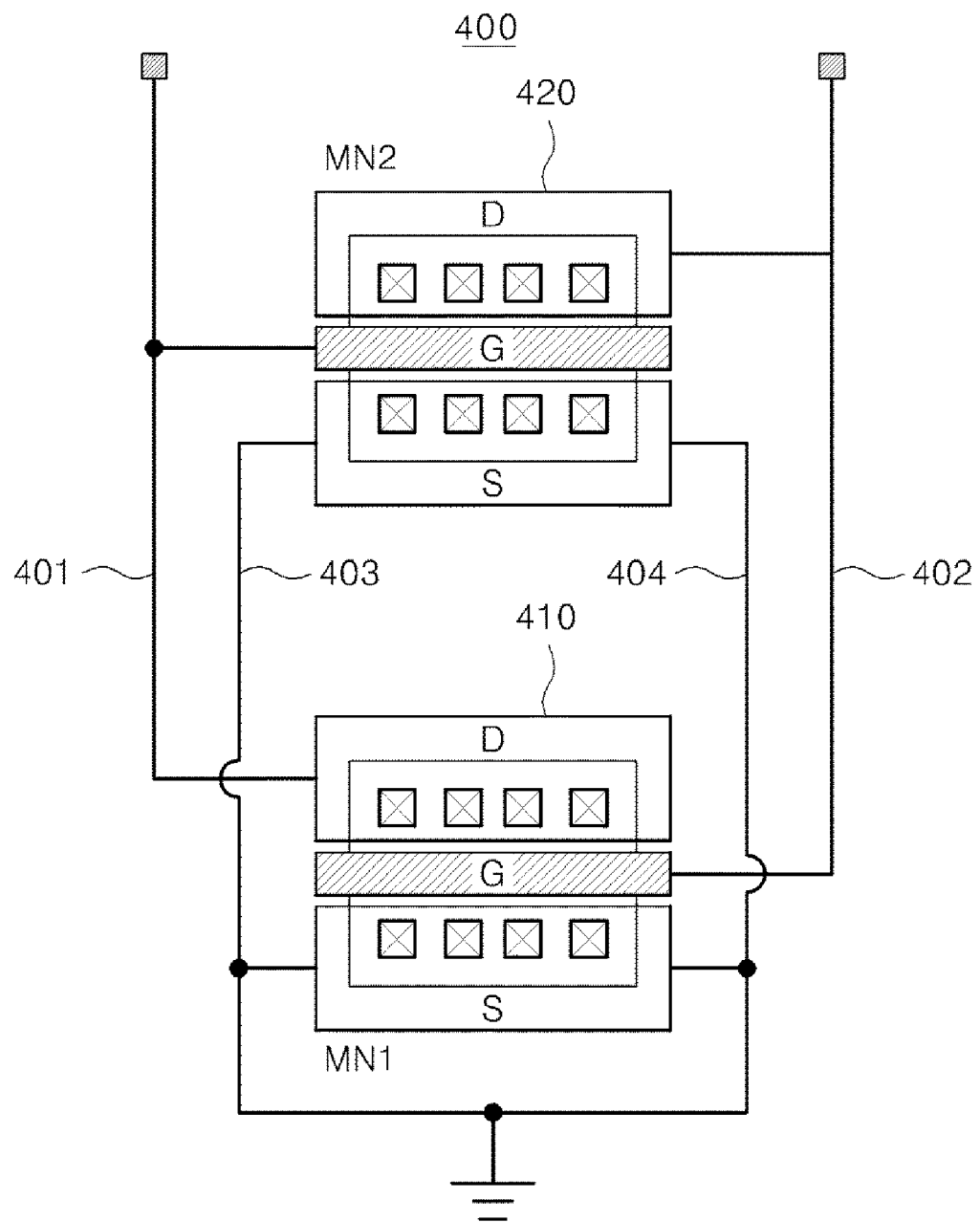

FIGS. 5A and 5B are diagram illustrating the configuration of an oscillator with a differential structure according to the second embodiment of the present invention.

As illustrated in FIGS. 5A and 5B, oscillators 300 and 400 with a differential structure according to the present invention, the same as the configuration of the first embodiment, includes, respectively, first transistors 310 and 410 and second transistors 320 and 420 in each of which a drain electrode, a gate electrode, and a source electrode are sequentially arranged. Accordingly, the same configuration as that of the first embodiment is not described and only the differences from the first embodiment are described.

According to the second embodiment of the present invention, the first transistor 310 and 410 and the second transistors 320 and 420 are arranged such that the source electrode of the first transistor 310 and the drain electrode of the second transistor 320 face each other, as illustrated in FIG. 5A, or the drain electrode of the first transistor 410 and the source electrode of the second transistor 420 face each other, as illustrated in FIG. 5B.

In the second embodiment, similar to the first embodiment, first wirings 301 and 401, second wirings 302 and 402, third wirings 303 and 403, and fourth wirings 304 and 404 are formed. Further, the first wirings 301 and 401 and the third wirings 303 and 403 cross over each other, respectively, at the left side that is a first end, and the second wirings 302 and 402 and the fourth wirings 304 and 404 cross over each other at the right side that is a second end.

In the second embodiment, similar to the first embodiment, crossovers are formed in a left-right symmetric structure, in relation to parasitic impedance components, and the numbers of crossovers may depend on the position of a ground power supply.

There may be an expansion embodiment of the first embodiment of the second embodiment of the present invention.

Figure 6:
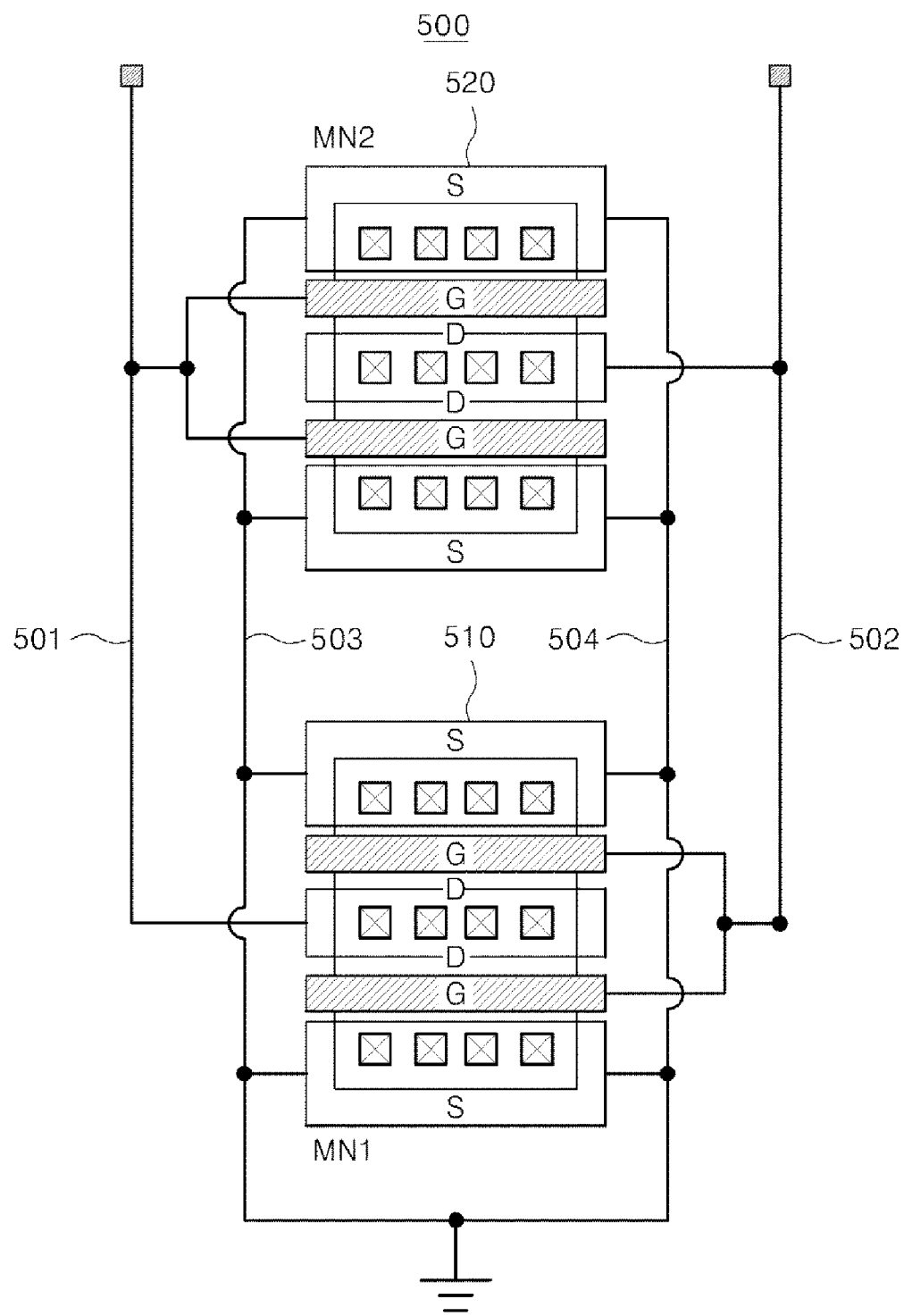
FIG. 6 is a diagram illustrating the configuration of an oscillator with a differential structure according to expansion of the first embodiment of the present invention.

FIG. 6 is a diagram illustrating the configuration of an oscillator with a differential structure according to expansion of the first embodiment of the present invention.

As illustrated in FIG. 6, a first transistor 610 and a second transistor 620 are arranged such that their source electrode face each other, in which the first transistor 610 and the second transistor 620 may be implemented in a multi-finger type including two or more drain electrodes or source electrodes. FIG. 6 illustrates arrangement of multi-finger type transistors each having two source electrodes. Expansion of the embodiments is not limited to the example described above and may be applied to two cases when source electrodes face each other and when a source electrode and a drain electrode face each other, as in the second embodiment. Further, expansion using various types of multi-finger transistors may be possible.

As described above, in the configurations of oscillators with a differential structure according to various embodiments of the present invention, the first transistors 110, 210, 310, 410, and 510 and the second transistors 120, 220, 320, 420, and 520 can be arranged such that two drain-gate wirings do not cross over each other, breaking with the type with drain-gate wirings crossing over each other which causes asymmetry in the related art. Further, the crossovers of the drain-gate wiring (first wiring or second wiring) and the source-source wiring (third wiring or fourth wiring) can be left-right symmetrically made by an addition source-source wiring.

According to the oscillators with a differential structure of embodiments of the present invention, it is possible to maintain symmetry between differential signals by means of the symmetric wirings in an integrated circuit and it is possible to improve output power of the oscillator and minimize a harmonic component. Further, it is possible to integrate the components of an oscillator in the minimum area in an integrated circuit.

As set forth above, according to exemplary embodiments of the invention, it is possible to maintain symmetry between differential signals by means of the symmetric wirings in an integrated circuit and it is possible to improve output power of the oscillator and minimize a harmonic component. Further, it is possible to integrate the components of an oscillator in the minimum area in an integrated circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. An oscillator with a differential structure which is formed in an integrated circuit, comprising:
    a first transistor and a second transistor arranged in series, and each of the first and second transistor comprising a drain electrode, a gate electrode, and a source electrode which being sequentially arranged,
    the first transistor and the second transistor arranged in series connection in which an arrangement of the drain, gate, and the source electrode of the first transistor is symmetrically arranged corresponding to an arrangement of the drain, gate, and the source electrode of the second transistor, wherein
    a drain of the first transistor is connected with a gate of the second transistor through a first wiring,
    a drain of the second transistor is connected with a gate of the first transistor through a second wiring, and
    a first end of a source of the first transistor and a first end of a source of the second transistor are connected through a third wiring, and a second end of the source of the first transistor and a second end of the source of the second transistor are connected through a fourth wiring, and wherein
    the first wiring and the third wiring are first crossover and the second wiring and the fourth wiring are second crossover, and the first crossover and the second crossover are symmetrically formed.

2. The oscillator of claim 1, wherein the third wiring and the fourth wiring are connected to a ground power supply.

3. The oscillator of claim 2, wherein the first wiring and the third wiring cross over each other not in contact with each other, and the second wiring and the fourth wiring cross over each other not in contact with each other.

4. The oscillator of claim 3, wherein the first wiring and the second wiring are made of the same material or the same element.

5. The oscillator of claim 4, wherein the drain of the first transistor and the drain of the second transistor are connected to an input power supply.

6. The oscillator of claim 4, wherein the first transistor and the second transistor are formed in multi-finger types including two or more of the drain electrodes or the source electrodes.

7. An oscillator, comprising:
    a first transistor and a second transistor arranged in series, and each arrangement of a drain electrode, a gate electrode, and a source electrode corresponding to the first and second transistor being symmetrically arranged, wherein
    a drain of the first transistor is serially connected with a gate of the second transistor through a first wiring,
    a drain of the second transistor is serially connected with a gate of the first transistor through a second wiring, and
    a first end of a source of the first transistor and a first end of a source of the second transistor are serially connected through a third wiring, and a second end of the source of the first transistor and a second end of the source of the second transistor are serially connected through a fourth wiring, and wherein
    the first wiring and the third wiring are first crossover and the second wiring and the fourth wiring are second crossover, and the first crossover and the second crossover are symmetrically formed.

8. The oscillator of claim 7, wherein the third wiring and the fourth wiring are connected to a ground power supply.

9. The oscillator of claim 8, wherein the first wiring and the third wiring cross over each other not in contact with each other, and the second wiring and the fourth wiring cross over each other not in contact with each other.

10. The oscillator of claim 9, wherein the first wiring and the second wiring are made of the same material or the same element.

11. The oscillator of claim 10, wherein the drain of the first transistor and the drain of the second transistor are connected to an input power supply.

12. The oscillator of claim 10, wherein the first transistor and the second transistor are formed in multi-finger types including two or more of the drain electrodes or the source electrodes.

* * * * *